(12) United States Patent
Airaksinen et al.

(10) Patent No.: US 9,797,935 B2
(45) Date of Patent: Oct. 24, 2017

(54) DEVICE, ARRANGEMENT AND METHOD FOR VERIFYING THE OPERATION OF ELECTRICITY METER

(71) Applicants: LANDIS+GYR OY, Jyskä (FI); LANDIS+GYR LTD., Zug (CH)

(72) Inventors: Risto Airaksinen, Jyskae (FI); Ari Koskinen, Kuohu (FI)

(73) Assignees: LANDIS+GYR OY, Jyska (FI); LANDIS+GYR AG, Zug (CH)

( * ) Notice: Subject to any disclaimer, the term of this patent is extended or adjusted under 35 U.S.C. 154(b) by 258 days.

(21) Appl. No.: 14/431,013

(22) PCT Filed: Sep. 3, 2013

(86) PCT No.: PCT/EP2013/002634
§ 371 (c)(1),
(2) Date: Mar. 25, 2015

(87) PCT Pub. No.: WO2014/048538
PCT Pub. Date: Apr. 3, 2014

(65) Prior Publication Data
US 2015/0276830 A1 Oct. 1, 2015

(30) Foreign Application Priority Data
Sep. 25, 2012 (GB) .................................. 1217046.0

(51) Int. Cl.
*G01R 22/06* (2006.01)
*G01R 11/24* (2006.01)
(Continued)

(52) U.S. Cl.
CPC ........... *G01R 22/068* (2013.01); *G01D 4/002* (2013.01); *G01R 35/04* (2013.01); *Y02B 90/241* (2013.01);
(Continued)

(58) Field of Classification Search
CPC .... G01R 22/066; G01R 22/068; G01R 11/24; G01R 11/25; G01R 19/2513; G08C 15/06
(Continued)

(56) References Cited

U.S. PATENT DOCUMENTS

| 6,043,642 A | 3/2000 | Martin et al. |
| 2002/0074990 A1* | 6/2002 | Shincovich .............. H04B 3/54 324/110 |

(Continued)

FOREIGN PATENT DOCUMENTS

| CN | 101 907 697 B | 7/2012 |
| WO | WO 97/44679 A1 | 11/1997 |

OTHER PUBLICATIONS

Great Britain Search Report for corresponding application GB1217046.0, dated Jan. 10, 2013.
(Continued)

*Primary Examiner* — Paresh Patel
*Assistant Examiner* — Neel Shah
(74) *Attorney, Agent, or Firm* — Brinks Gilson & Lione

(57) ABSTRACT

An electronic electricity meter (102) for monitoring electrical power consumption due to a plurality of loads, comprising electric power sensor (506A, 506, 502, 504, 508) configured to register, optionally in a substantially real-time fashion, data indicative of aggregate power demand (202) of a number of loads coupled to a common electrical power source, such as one or more phases of a polyphase system, load tracker (506B, 506, 502, 504) configured to detect the effect of individual loads on the basis of distinctive load patterns in said data, wherein the tracker is configured to utilize a distinctive load pattern detected in said data as at least a basis for a reference pattern (304, 306, 308) for subsequent detections (304a, 306a, 308a) of the effect of the same load in the data, accuracy analyzer (506C, 506, 502,
(Continued)

504) configured to, on the basis of comparisons of subsequent detections with the corresponding references, determine (312, 314, 316) whether the comparisons relating to at least two, preferably three, loads each indicate the difference between the subsequently detected pattern and the corresponding reference exceeding a predetermined threshold, and notifier (506D, 506, 502, 504, 508) configured to send, provided that positive determination has taken place (318), a notification signal indicative of potential fault with the electricity meter towards an external entity (106, 108). Corresponding arrangement and method are presented.

16 Claims, 5 Drawing Sheets

(51) Int. Cl.
G01R 11/25 (2006.01)
G01R 19/25 (2006.01)
G08C 15/06 (2006.01)
G01D 4/00 (2006.01)
G01R 35/04 (2006.01)

(52) U.S. Cl.
CPC .............. *Y02B 90/245* (2013.01); *Y04S 20/32* (2013.01); *Y04S 20/36* (2013.01); *Y04S 20/38* (2013.01); *Y04S 20/40* (2013.01)

(58) Field of Classification Search
USPC ..... 324/74, 110; 340/870.02; 702/58, 61, 62
See application file for complete search history.

(56) References Cited

U.S. PATENT DOCUMENTS

| 2003/0139939 | A1 | 7/2003 | Spool |
| 2005/0234837 | A1 | 10/2005 | Ramachandran et al. |
| 2006/0202858 | A1* | 9/2006 | Holle .................. G01R 22/066 340/870.02 |
| 2009/0045976 | A1* | 2/2009 | Zoldi .................... G01D 4/004 340/870.02 |
| 2011/0301894 | A1 | 12/2011 | Sanderford |
| 2012/0041696 | A1* | 2/2012 | Sanderford, Jr. ...... G01D 4/004 702/62 |

OTHER PUBLICATIONS

International Search Report from corresponding international application No. PCT/EP2013/002634, 3pp., dated Nov. 20, 2013.
Hannu Pihala, VTT Energy, Non-Intrusive Appliance Load Monitoring System Based on a Modern kWh-Meter, Technical Research Centre of Finland ESPOO 1998, 71pp, May 1998.

* cited by examiner

DEVICE, ARRANGEMENT AND METHOD FOR VERIFYING THE OPERATION OF ELECTRICITY METER

FIELD OF THE INVENTION

Generally the present invention pertains to electricity and electric power distribution. In particular, the invention relates to monitoring and verifying the operation of the electricity meters.

BACKGROUND

In households, e.g. electric (space) heating, fridge and freezer, boiler, lighting, consumer electronics, ventilation and air-conditioning often represent the biggest loads to the electricity network. In contrast, with industrial environments different large-scale processes and related machinery may naturally consume considerable amounts of energy including electricity. Equally in both scenarios, the energy consumption shall be accurately measured to enable, among other potential uses, appropriate, fair billing thereof, usually based on unit price without forgetting potential other price-affecting factors such as time of the day (tariff).

Contemporary solutions for keeping track of site-specific, such as plant or house-specific, electricity consumption are typically based on automatically functioning electricity meters that measure the amount of energy used by the local loads such as different electrical appliances mentioned above.

Generally, the electricity meters may, for example, phase-specifically monitor the associated voltages and currents to produce phase-specific and subsequently aggregate consumption figures. Power figures may be first obtained by measuring the instantaneous voltage and current, whereas an indication of the consumed energy is obtained as the time integral of power. For instance, the meters may be configured to measure energy consumption using kWh (kilowatt hour) or joules as units. Power demand may be measured e.g. in watts (W) and is often averaged over a predetermined period. Commercial and industrial electricity users are customarily billed on both consumption and (peak) demand basis, whereas residential users are charged for consumption only. More complex charging schemes require also more complex electricity meters.

Older electricity meters in use may still be electromechanical based on e.g. rotating aluminum disc sensitive to the consumed power and require manual reading by the personnel of the power company, for instance. More modern counterparts are, however, electronic incorporating microprocessor-based current/voltage analysis and often support remote reading (telemetry) by means of telephone lines, power lines or wireless communication technology, with reference to various AMR (Automatic Meter Reading) or RMR (Remote Meter Reading) systems. Further, different smart meters capable of e.g. power quality monitoring have been set forth.

There are also various portable energy monitors available, which can be used to check the energy consumption and related parameters regarding a single host device (load) by plugging the host device such as a consumer electronics device to the mains via the energy monitor.

Notwithstanding the obvious benefits the modern metering solutions offer in monitoring the electricity consumption, there still remains some room for improvements. Namely, it is a globally acknowledged fact that the electricity meters sometimes fail either completely or begin to register false readings during their life cycle even though specific attention on the measurement accuracy has been taken during the manufacturing of the meters and the related design rules and standards have been followed. As also the legal framework around electricity metering is continuously tightening and various countries have enacted laws or rules on securing the measuring accuracy of electricity consumption also in the long run, i.e. after the deployment of the measuring equipment, there's a growing need to provide applicable solution for such.

On system level, e.g. a power company may be capable of recognizing anomalies in electricity consumption when comparing e.g. monthly consumption figures of a monitored site relative to several passed months and e.g. the same month in previous year and maybe the year before. Additionally, several similar sites may be mutually compared to find anomalies such as statistically significant deviation between the registered electricity usage statistics. Based on a detected anomaly in the electricity consumption figures, meter malfunction may be certainly suspected as one possible explanation, but reaching even such a vague conclusion takes considerable amount of time.

Further in some occasions, random samples may be exploited for generally testing the installed electricity meters, which usually requires visiting a number of randomly picked sites, e.g. one of thousand, by the maintenance personnel equipped with the necessary testing gear. Alternatively, the personnel may be instructed to collect the meters for remote laboratory testing and to at least temporarily replace the taken away meter with a reserve unit. In the ultimate case, the tested, passed unit will be finally returned to the original site by the personnel. Such procedures require vast amounts of manual labor, are tedious and still a good number of faulty meters may remain in use, i.e. the obtained level of certainty is not satisfactory when fault-free, validated operation of basically every electricity meter, not just some percentage thereof, is desired.

SUMMARY OF THE INVENTION

The objective is to alleviate one or more problems described hereinabove and not yet satisfactorily addressed by the known arrangements, and to provide a feasible option for validating the measuring accuracy of an electricity meter.

The objective is achieved by the embodiments of an electricity meter, arrangement, and method in accordance with the present invention. Computer software that may be stored on a carrier medium may be provided to carry out method items when run on a computer.

Accordingly, in one aspect of the present invention an electronic electricity meter for monitoring electrical power consumption due to a plurality of loads, comprises
electric power sensor configured to register, optionally in a substantially real-time fashion, data indicative of aggregate power demand of a number of loads coupled to a common electrical power source, such as one or more phases of a polyphase system,
load tracker configured to detect the effect of individual loads on the basis of distinctive load patterns in said data, wherein the tracker is configured to utilize a distinctive load pattern detected in said data as at least a basis for a reference pattern for subsequent detections of the effect of the same load in the data, accuracy analyzer configured to, on the basis of a comparison of a subsequent detection of the effect of a load with the corresponding reference, determine whether such comparisons relating to at least two, preferably three, loads each indicate the difference between the subsequent pattern and the corresponding reference exceeding a predetermined threshold, and notifier configured to send, provided that positive determination has taken place, a notification signal indicative of potential fault with the electricity meter towards an external entity.

In one embodiment a load pattern, or 'fingerprint', represents a characteristic change in the monitored aggregate demand, such as on/off and/or active/reactive type change, which preferably exceeds a predetermined static or dynamic threshold. For example, a power change exceeding 500 W, e.g. 750 W, could be recognized as a load pattern indicative of load on (positive change, i.e. demand increase) or load off (negative change, i.e. demand decrease) situations. In some embodiments, the stability of the power readings or associated changes may be determined utilizing e.g. standard deviation method. According to predetermined criteria, only stable enough measurements (data samples) or measurement periods may be then taken into account.

In another, either supplementary or alternative, embodiment the applied frequency for acquiring and/or analyzing data samples is preferably higher than about 0.1 Hz, more preferably higher than about 0.5 Hz, and most preferably equal to or higher than about 1.0 Hz.

In a further, either supplementary or alternative, embodiment the load tracker may be configured to adapt a reference after initial determination thereof on the basis of data analysis according to predetermined logic. For example, a pattern associated with a load may evolve due to new programming of the load-causing electrical apparatus, and/or new usage thereof, whereupon the reference pattern may be adapted accordingly.

Still in a further, either supplementary or alternative, embodiment, identification of a load pattern further incorporates utilization of at least one element selected from the group consisting of: date, time, load balance, active power, and reactive power. The element may be included in or be derivable from the data, or be otherwise associated therewith.

Indeed, each load or related load pattern may be associated with a number of characterizing values of the aforementioned or other elements, whereupon detection of such values or value combinations in said data and/or on the basis of said data (derived therefrom, for instance) may be utilized as a positive indicator in recognizing the associated load and vice versa. For example, if certain load is mainly switched on Mondays based on history information, date-characterizing element may add positively to the decision criteria concerning the detection of the load pattern of such load on Mondays. The element values may be adapted based on the analysis of the data.

Yet in a further, either supplementary or alternative, embodiment the notification ion signal, e.g. status signal, includes a wireless or wired signal. The signal may be transmitted utilizing at least one predetermined transfer technology or medium selected from the group consisting of: LAN, WLAN (or 'Wi-Fi'), internet, Bluetooth, telephone network, cellular network such as GSM (Global System for Mobile Communications) or UMTS (Universal Mobile Telecommunications System), GPRS (General Packet Radio Service), power lines (PLC, Power Line Communication), and a proprietary type of connection. In addition to notifying about potential fault with the electricity meter, the notification signal(s) may be transmitted to indicate or report a number of predetermined other issues to a remote recipient such as electricity usage data, various sensor data, etc. In some embodiments, messages may be also transmitted in reverse direction to control the electricity meter or a device coupled thereto, for example.

In a further, either supplementary or alternative, embodiment the accuracy analyzer is configured to further verify whether the determined differences (i.e. differences between the subsequently detected load patterns and related references) are mutually about the same regarding said at least two loads according to predetermined criterion. Accordingly, the notifier may be configured to send the notification signal only if this is the case, i.e. the verification adds a new triggering condition for the notification signal. In various embodiments, the differences may be calculated as relative differences, such as percentages, as to be described in further detail hereinafter.

In a further supplementary embodiment, in case the determined differences are mutually substantially unequal according to predetermined criterion, at least one of the reference patterns, such as the one with the greatest difference to the subsequently detected pattern, may be deemed invalid by the meter. For example, in case where the differences are mutually about the same regarding first and second loads but deviating from the third one, the third reference may be deemed invalid and be deleted. New reference determination procedure may take place.

In a further, either supplementary or alternative, embodiment, the meter is configured to utilize, in said determination, the most recent detection of each load pattern as provided by the load tracker. Preferably the load tracker is configured to detect each subsequent instance of a previously identified (i.e. existing reference-linkable) load pattern.

In a further, either supplementary or alternative, embodiment, the load tracker is configured to determine a number of initial reference patterns based on the first distinctive load patterns detected after the installation of the meter.

In a further, either supplementary or alternative, embodiment the load tracker may be configured to characterize or truly identify the detected load. It may, for example, deduce its nature or appliance class (boiler, fridge, freezer, etc.) based on the load pattern and optionally associated elements such as usage times.

In another aspect, an electronic arrangement for verifying the operation of an electricity meter configured to monitor electrical power consumption due to a plurality of loads, comprises electric power tracker configured to obtain data indicative of aggregate power demand of a number of loads coupled to a common electrical power source, such as one or more phases of a polyphase system, as measured by the meter, load tracker configured to detect the effect of individual loads on the basis of distinctive load patterns in said data, wherein the tracker is configured to utilize a distinctive load pattern detected in said data as at least a basis for a reference pattern for subsequent detections of the effect of the same load in the data, accuracy analyzer configured to, on the basis of a comparison of subsequent detections of the effect of loads with the corresponding references, determine whether the comparisons relating to at least two, preferably three, loads each indicate the difference between the subsequent pattern and the corresponding reference exceeding a predetermined threshold, and notifier configured to trigger, provided that positive determination has taken place, a notification signal indicative of potential fault with the electricity meter.

The arrangement may comprise or consist of an electronic device, such as a dedicated analyzer or a multi-purpose server, which is at least functionally connected to the electricity meter to obtain data therefrom. Further the arrangement may comprise the meter itself and optional other elements such as the external entity like remote meter reading system.

In a further aspect, a method for verifying the operation of electricity meter, comprises
obtaining, optionally in a substantially real-time fashion, data indicative of aggregate power demand of a number of loads coupled to a common electrical power source, such as one or more phases of a polyphase system,
detecting the effect of individual loads in said data on the basis of distinctive load patterns therein, wherein a distinctive load pattern detected in said data is utilized as at least a basis for a reference pattern for subsequent detections of the effect of the same load in the data,
comparing a subsequent detection of the effect of a load with the corresponding reference, and determining whether such comparisons relating to at least two, preferably three, loads each indicate the difference between the subsequent pattern and the corresponding reference exceeding a predetermined threshold, and
triggering, provided that positive determination has taken place, a notification signal indicative of potential fault with the electricity meter.

The method may further comprise receiving the signal at the external entity and triggering a maintenance action, such as sending a maintenance request message, relating to the meter.

The previously presented considerations concerning the various embodiments of the electricity meter may be flexibly applied to the embodiments of the arrangement or method mutatis mutandis, and vice versa, as being appreciated by a skilled person.

The utility of the present invention arises from a plurality of factors depending on each particular embodiment. First of all, the operation of the electricity meters, particularly measurement accuracy, may be validated substantially in real-time utilizing the hardware the meter already may have, i.e. processing and memory capacity, with particular reference to so-called modern smart meters. The monitoring logic may be implemented in the meter itself or at least partially disposed in an external apparatus or module at least functionally connected to the meter for obtaining the necessary data.

Additionally, a remote party may be conveniently notified regarding the status of the meter such as a suspected fault situation. Fault situations may be detected both quickly and reliably regarding each meter. Manual labor and related expenses associated with maintenance personnel more or less randomly visiting different sites for checking the operation of on-site electricity meters, as done in the past, may be omitted.

Various principles of non-intrusive load monitoring (NILM) may be generally utilized to analyze the electricity usage at different sites in necessary detail. Different loads may be detected and also optionally qualified as to their nature/type/class (e.g. boiler, heating, fridge or freezer). Optimization of electricity usage may be performed as a result based on e.g. electricity pricing including tariffs or the minimization of consumption overhead.

The expression "a number of" refers herein to any positive integer starting from one (1), e.g. to one, two, or three.

The expression "a plurality of" refers herein to any positive integer starting from two (2), e.g. to two, three, or four.

The terms "first" and "second" do not denote herein any particular priority or order. Instead, they are used to distinguish one entity such as a physical or logical element from another entity.

Different embodiments of the present invention are disclosed in the dependent claims.

BRIEF DESCRIPTION OF THE RELATED DRAWINGS

Next the invention is described in more detail with reference to the appended drawings in which FIG. 1 illustrates a potential use scenario of various embodiments of the present invention.

DETAILED DESCRIPTION

Figure 1:
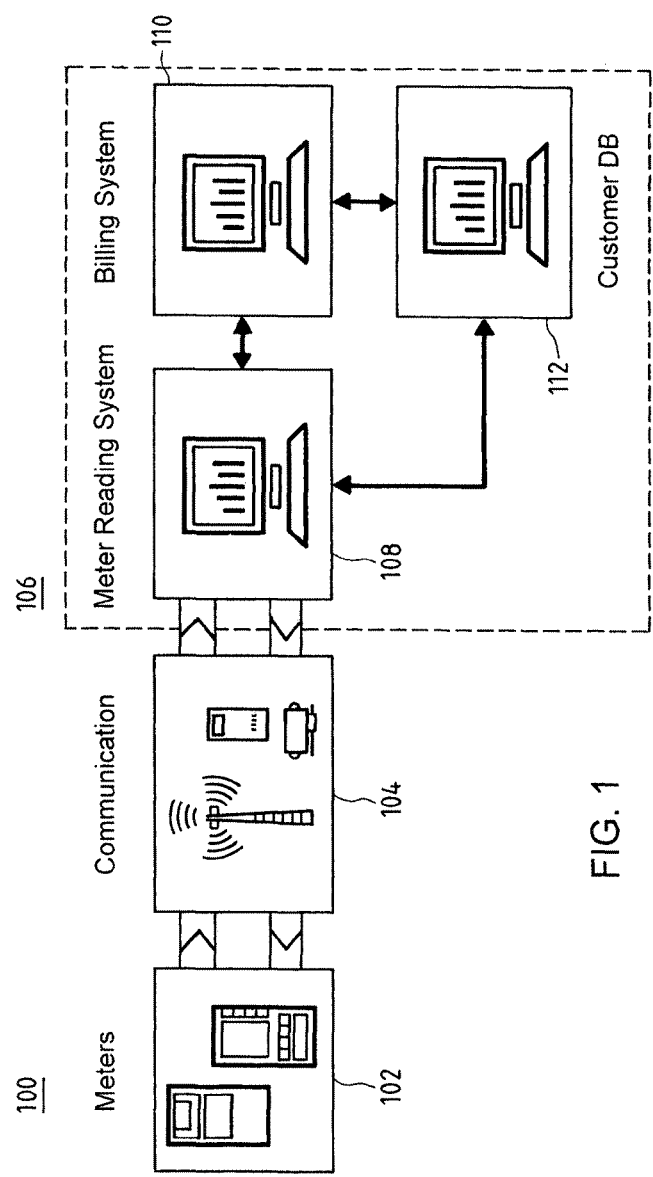

FIG. 1a is a sketch illustrating, at 100, a potential use scenario and a plurality of related entities regarding different embodiments of the present invention.

A number of electricity meters 102 may be connected via a number of communication paths 104 such as communications or at least communications-enabling, such as power, networks to a remote system 106 operated by electric utility, for example, and containing among other potential elements e.g. a meter reading system 108, a billing system 110 and a customer database 112 that are at least functionally mutually connected.

The electricity meters 102 utilized in connection with the present invention may differ depending on the use scenario and related needs. They may measure power and preferably also energy (power integral) according to predetermined standards regarding e.g. AC/DC current and the phase configuration in connection with AC current (single phase vs. polyphase such as two- or three-phase). In case of polyphase monitoring, the meters 102 may be configured to monitor one or more of the phases either independently and/or jointly.

The meters 102 may be configured to constantly sample the voltage and current, e.g. once a second, or tens, hundreds or even thousands of times a second. For each sample, the voltage may be multiplied by the current at the same instant to obtain indication of power.

The meters 102 may be configured to monitor any related parameter such as active power, reactive power, complex or apparent power, and/or consumed energy (power integral). The readings may be displayed on the device, retained to arrange a log and calculate e.g. long-term statistics such as trends or averages.

Figure 2:
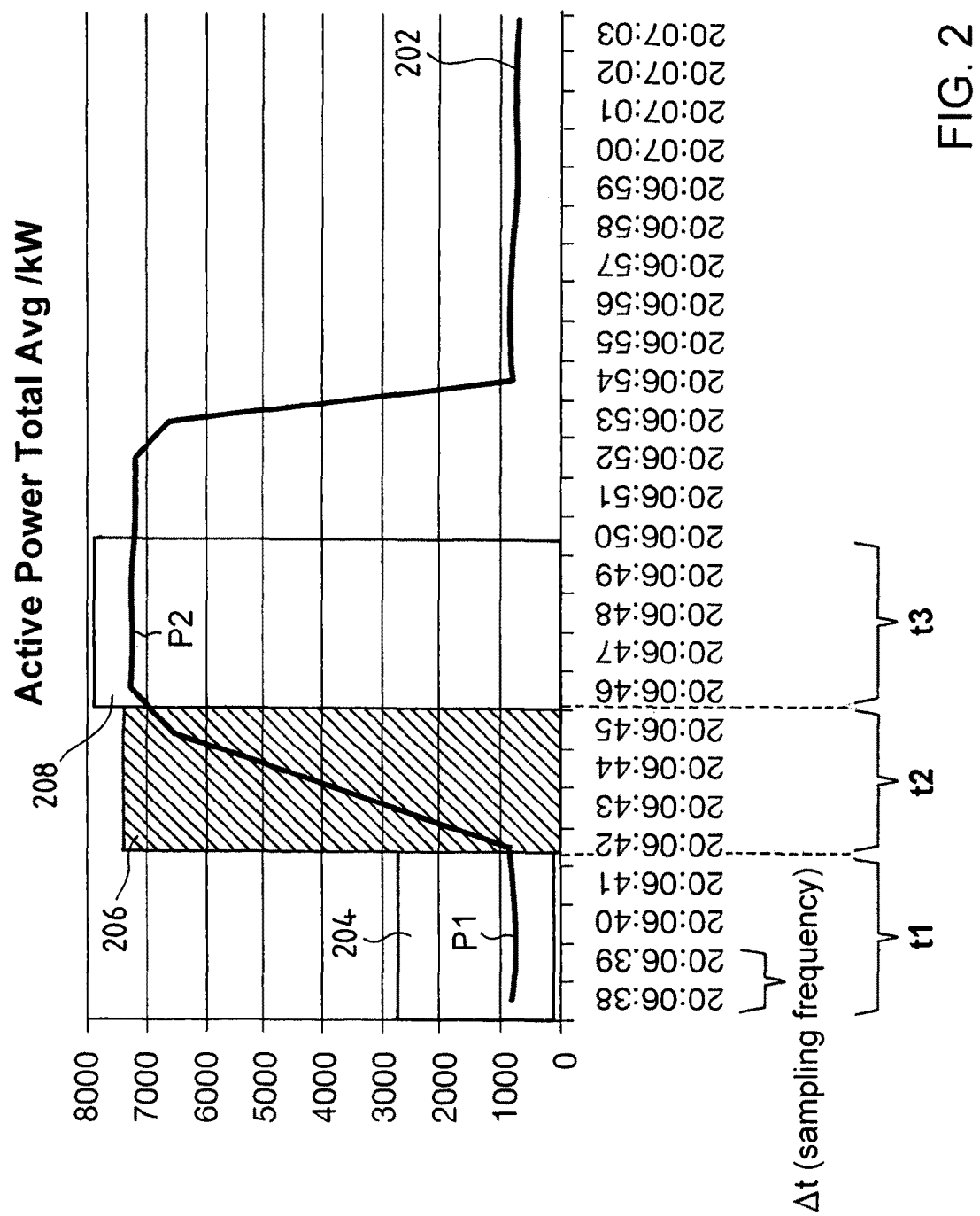
FIG. 2 depicts a power curve for visualizing different data monitoring and analysis concepts generally exploited in the embodiments of the present invention.

FIG. 2 depicts, by way of example only, a power curve 202 (three-phase system) for visualizing different data monitoring and analysis concepts generally feasible in the embodiments of the present invention.

The electricity meter contains an electric power sensor, in practice including a number of sensor elements, for obtaining data indicative of aggregate power demand of a number of loads coupled to a common electrical power source, such as one or more phases of a polyphase system. The phases may be generally analyzed jointly (total power) or in isolation.

Different loads such as household appliances operated by electric energy may have characterizing load patterns that imply e.g. a certain ramp-up, off/on-state and ramp-down curve shapes, and/or certain amount of power dissipation. Thus, a load tracker entity may be provided and configured to detect the effect of individual loads on the basis of distinctive load patterns in the obtained data.

In the shown case the data samples (one per second) indicate that the somewhat stable periods t1 and t3 of power levels P1 204 with dissipation slightly under 1000 kW and P2 208 with dissipation slightly over 7000 kW, respectively, have a transition period, i.e. unstable period, between them at 206 as represented by a transitional ramp-up curve shape. It is thus preferably noticed by the load tracker that a new load has been introduced at 206 to the system. The tracker may now determine a number of characteristics regarding the load such that a reference pattern for subsequent detections of the same load may be established, provided that the load has not already been modeled into a reference pattern in which case the tracker may identify this new instance of a known load's load pattern and provide the data to meter accuracy analyzer.

The tracker may thus generally detect, or 'identify', loads (patterns) such that the subsequent occurrences of the same load (pattern) can be linked with the first one. It is thus not necessary, although being possible, to identify the load in a sense of non-intrusive load monitoring, i.e. determine the actual load class (e.g. fridge, boiler, oven, etc.) and related data (brand, model, etc.), based on the power data.

Load patterns detections may rely on a number of (pre-) conditions such as sufficient stability of power. For example, reference R could be determined on the basis of difference between stable power levels P1 204 and P2 208, such as subtraction P2-P1, while omitting the unstable intermediary (ramp-up) period 206 from the calculations.

Naturally various other supplementary or alternative methods for load/reference detection may be applied.

Figure 3:
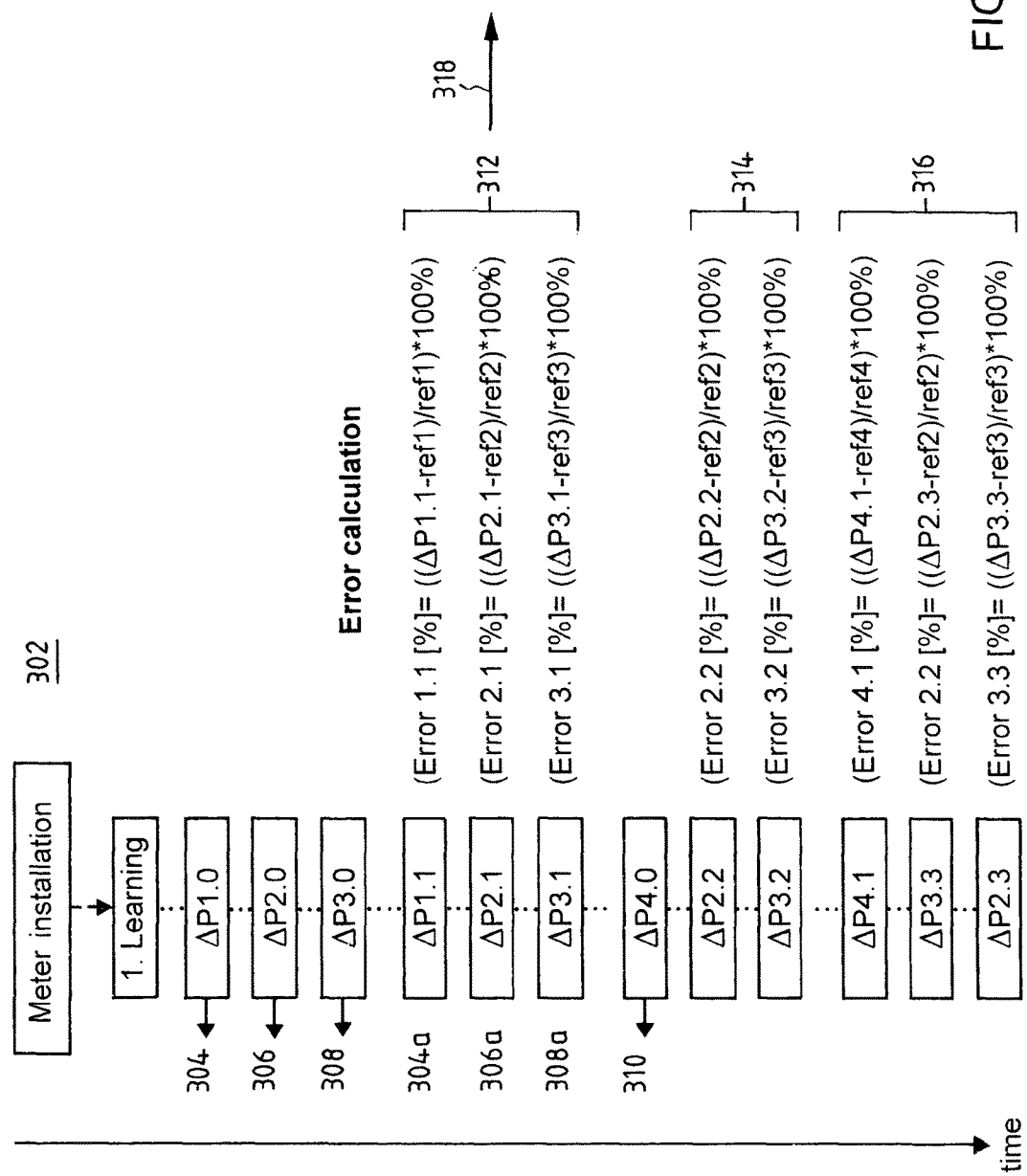
FIG. 3 illustrates an embodiment of the overall procedure incorporating analysis of meter error.

FIG. 3 illustrates, at 302, an embodiment of reference determination (learning) and subsequent load monitoring with related analysis.

Indeed, the load tracker may identify, or 'learn', the patterns of new loads and determine the corresponding references 304, 306, 308 on the basis thereof. The subsequent instances 304a, 306a, 308a of the same load patterns are then later recognized from the aggregate power signal on the basis of the already-stored references. For example, a characteristic ramp-up time and power dissipation (increase) as mentioned above could be utilized to a link change in the aggregate power demand with a certain load. Predetermined amount of deviation from the reference's characteristics may be tolerated to still deem the current pattern under detection with the reference.

Each subsequent instance 304a, 306a, 308a of a load pattern may be compared with the associated reference 304, 306, 308 according to predetermined logic. For example, percentual difference, or 'error', between the subsequent instance 304a of a load pattern and the corresponding reference pattern 304 may be calculated as shown in the figure at 312 (top row 'Error 1.1').

As various subsequent instances of different already-modeled (reference-provided) load patterns show up in the data, the analyzer is preferably configured to exploit multiple, preferably at least three, such differences between the subsequent (advantageously most recent) instances and the corresponding (mutually different) references, however in a mutually compatible, typically exactly the same, manner as shown at 312 in relation to subsequent instance/reference pairs 304a/304, 306a/306, and 308a/310 for which all the same percentual difference parameter ('Error') has been determined. Further comparison rounds regarding different combinations of loads are illustrated at 314 and 316.

In case new unrecognized loads seem to appear in the data, new reference patterns 310 may be correspondingly established for future use. However, to analyze the accuracy of the meter, at least two, preferably at least three, difference measures shall be determined and jointly analyzed as described herein.

In case the differences are mutually about the same among the loads (subsequent instance/corresponding reference-pairs) according to predetermined criterion, i.e. there seems to be common deviation between each subsequent instance and corresponding reference, and not just single-load related deviation that could indicate e.g. load failure or change in the operation of the load, and further preferably if the differences are large enough according to predetermined criterion (greater than threshold) and optionally still below predetermined limit(s), erroneous function and reduced measurement accuracy of the electricity meter may be suspected. A related indicative signal 318 may be triggered to notify desired entities such as power company (meter reading system), maintenance company and/or meter manufacturer.

In case only e.g. a single load seems to change or evolve in terms of the associated characteristic load pattern, i.e. the subsequent detections more or less consistently differing from the original reference, the reference may be optionally adapted accordingly to better reflect the permanent or at least recurring new load pattern of the load.

The above kind of overall decision-making utilizing the available differences, preferably a plurality of latest determinable differences, may be executed when the applied criterion/criteria is fulfilled, e.g. upon detection of any new (subsequent) instance of a known load in the data or after e.g. two or more of such detections. Timed analysis utilizing the latest differences is also possible in addition to various other triggering rules such as receipt of an external triggering signal e.g. from the data system of a power company (electric utility) or some other entity.

Figure 4:
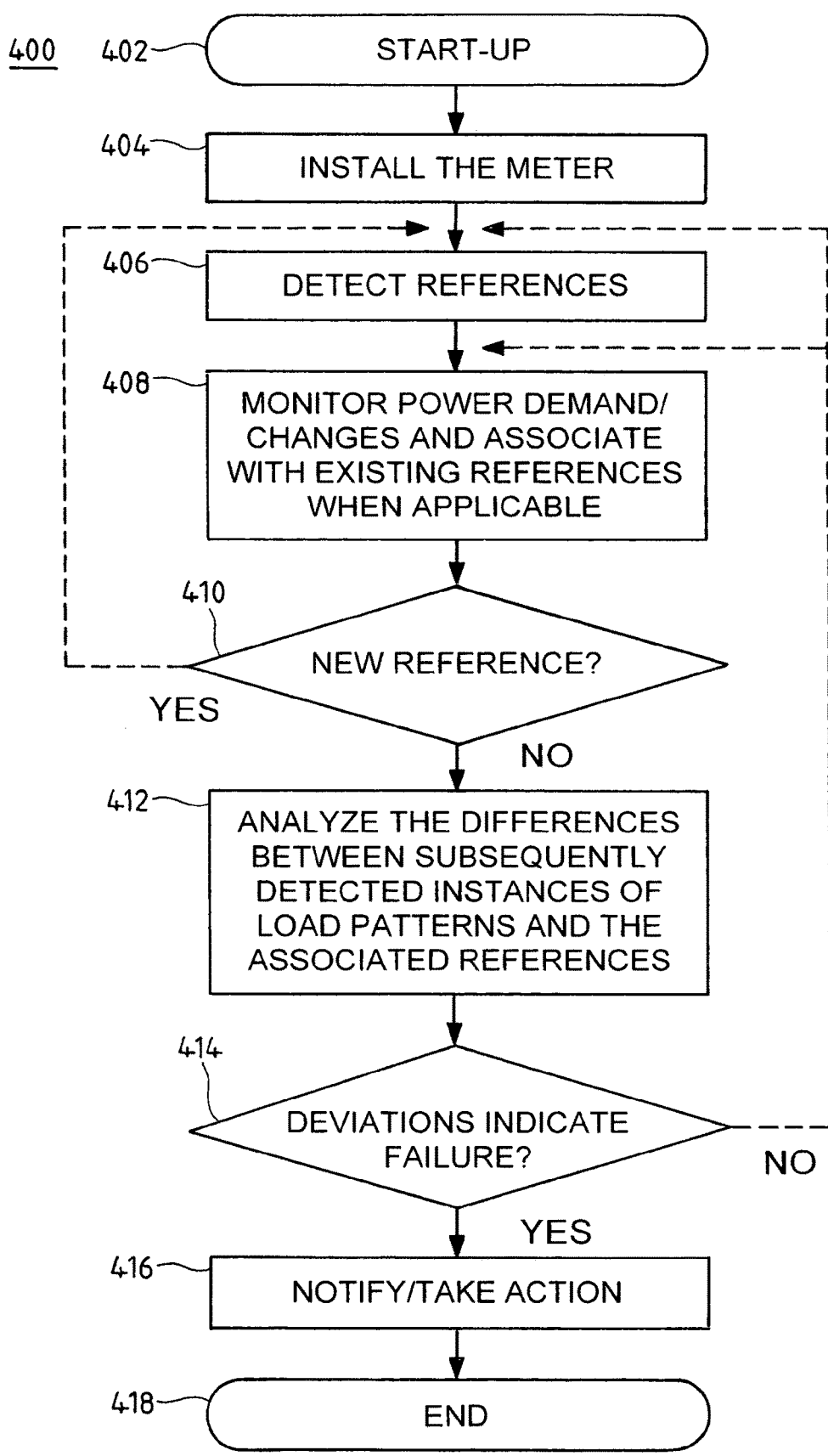
FIG. 4 is a flow chart of an embodiment of a method in accordance with the present invention.

FIG. 4 includes a flow chart 400 of an embodiment of a method in accordance with the present invention.

At 402, the utilized equipment such as an embodiment of an electricity meter or at least a functionally connectable apparatus in accordance with present invention is obtained.

At 404, the necessary software (logic) may be installed and the meter/apparatus may be properly positioned relative to the target environment with reference to e.g. an electrical cabinet or a fuse box. Data connectivity may be established and tested. Further optionally, the user may tailor the utilized detection, alarming and potential other parameters to optimize them for the current application.

At 406, potentially taking place right after the install of meter, the meter/apparatus detect the reference(s) on the basis of the sampled power data.

At 408, the power demand is still preferably continuously monitored and subsequent instance of already reference-modeled load detected.

At 410, a new reference may be established when a previously unknown load pattern is detected in the data.

At 412, it is determined, on the basis of a comparison of a subsequent detection of the effect of a load with the corresponding load (pattern)-specific reference (a skilled reader will understand that the actual comparison may have already taken place during load pattern detection or be executed at this stage, for instance), whether the differences between the subsequent pattern and the corresponding reference regarding at least two, preferably at least three loads, fulfill predetermined criteria, preferably at least exceed a predetermined threshold and/or are mutually about the same, e.g. same order of magnitude. In other words, at least two such differences each of which concerning different load (reference/subsequent detection pair) are jointly analyzed in search of a common denominator. Absolute and/or percentual criteria may be applied in contemplating the similarity of the differences, for example.

If the utilized criteria are fulfilled, which is checked at 414, a number of associated action(s) may be executed at 416 implying triggering the transmission of a notification signal, for example. The signal may be internal to the triggering device and/or targeted towards external entity/entities.

The method execution is ended at 418. The dotted loop-back arrow indicates the repetitive nature of the various method items. The data acquisition, analysis, alarm triggering, etc. may include substantially continuous procedures, periodical procedures, and/or intermittently executed (activated/deactivated) procedures.

Figure 5:
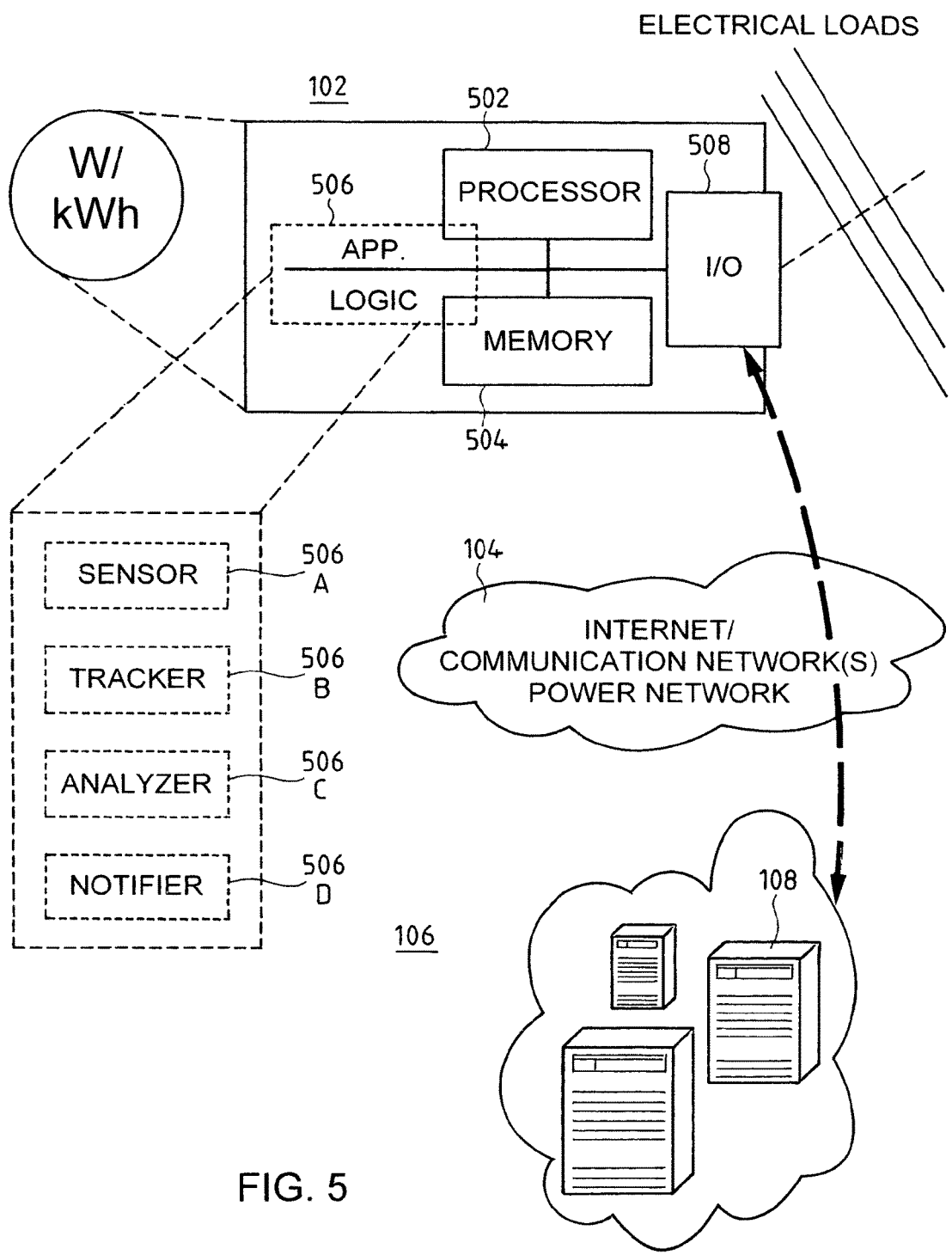
FIG. 5 is a block diagram representing the internals of an embodiment of an electricity meter or at least functionally connected arrangement in accordance with the present invention.

FIG. 5 is a block diagram representing the internals of an embodiment of an electricity meter or at least a functionally connected apparatus in accordance with the present invention.

More from the standpoint of hardware, the meter/apparatus 102 may comprise at least one processing device 502 such as a microprocessor, a DSP (digital signal processor), a microcontroller, a programmable logic chip, etc. The processing device 502 may be integrated with or at least functionally connected to a memory element 504 such as a memory chip comprising RAM (random-access memory) and/or ROM (read-only memory) memory for storing instructions and/or other data. I/O entity 508 may comprise different applicable connectivity elements to at least functionally couple with the power conductors to measure power consumption (or to the electricity meter in case an external analysis apparatus/system is used). Yet, it 508 may include a number of transceiver(s) capable of transferring data between the device 102 and an external entity 106 such as a meter reading system and related apparatuses 108. For instance, communication utilizing cellular, WLAN (Wi-Fi), LAN, power network, infrared and/or Bluetooth connectivity may be provided. A user interface (UI) may be provided and physically include a number of buttons, knobs, a screen (display), a touchscreen, a touch pad, a keypad, a keyboard, switches, and/or a microphone.

The device 102 may be powered by a battery, preferably a rechargeable battery such as a rechargeable Li-ion battery. Alternatively, the device 102 may be connected to the mains or other source of electrical energy by wire or wirelessly, optionally inductively. The battery may still function as a reserve power source.

The operation of the device 102 to carry out the functionalities described in this text may be controlled by software such as meter accuracy monitoring and reporting/alarming application 506 comprising a plurality of instructions stored in the memory 504 and executed by the processing entity 502. The software may be tailored according to the requirements set by the underlying platform.

Logic such as software logic may be configured to implement electric power sensor 506A, load tracker 506B, accuracy analyzer 506C, and notifier 506D entities obviously along with the necessary hardware, such as processing, memory and I/O means. Persons skilled in the art will understand that physical realizations of the logical entities 506A, 506B, 506C, 506D may vary depending on the embodiment, and as such, the entities 506A, 506B, 506C, 506D do not have to be explicitly defined as long as the intended functionality provided by them is present, i.e. in various realizations the aforementioned logical entities 506A, 506B, 506C, 506D may appear as combined or split into further entities, for example.

The software 506 may be provided as a computer program product embodied in a computer readable storage (carrier) medium such as a memory stick, memory card, optical disc, floppy disc, hard disc, etc. The software 506 may be further delivered over a wired or wireless network or other connection.

A skilled person may, on the basis of this disclosure and general knowledge, apply the provided teachings in order to implement the scope of the present invention as defined by the appended claims in each particular use case with necessary modifications, deletions, and additions, if any. Different features of the embodimeats described hereinbefore may be flexibly utilized and combined to construct new embodiments as understood by the person skilled in the art.

The invention claimed is:

1. An electronic electricity meter for monitoring electrical power consumption due to a plurality of loads, comprising:
   an electric power sensor configured to register data indicative of aggregate power demand of a number of loads,
   a load tracker configured to detect the effect of individual loads on the basis of distinctive load patterns in said data, wherein the tracker is configured to utilize a distinctive load pattern detected in said data as at least a basis for a reference pattern for subsequent detections of the effect of the same load in the data,
   an accuracy analyzer configured to, on the basis of comparisons of subsequent detections with the corresponding references, determine whether the comparisons relating to at least two loads each indicate the difference between the subsequently detected pattern and the corresponding reference exceeding a predetermined threshold, and
   a notifier configured to send, provided that positive determination has taken place, a notification signal indicative of potential fault with the electricity meter towards an external entity.

2. The meter of claim 1, wherein the accuracy analyzer is further configured to determine whether the comparisons relating to said at least two loads indicate differences that are about the same according to predetermined criterion, whereupon the notifier is further configured to send the notification signal.

3. The meter of claim 2, configured to deem, in case of substantially unequal differences, at least one of the references invalid.

4. The meter of claim 1, wherein the load pattern indicates power demand of a load.

5. The meter of claim 1, configured to utilize most recent available instance of each detected load pattern in said determination.

6. The meter of claim 1, configured to determine the reference patterns on the basis of first distinctive load patterns detected after a predetermined event.

7. The meter of claim 1, wherein indication of stability of data is determined and portions deemed as unstable according to predetermined criterion that are omitted in the load detection.

8. The meter of claim 1, configured to change a corresponding reference in response to detecting a change relative to a load pattern while the rest of the load patterns remain substantially unchanged.

9. The meter of claim 1, configured to determine the product class of a detected load on the basis of the load pattern.

10. The meter of claim 1, configured to detect a load based on said data through utilization of at least one element selected from the group consisting of: date, time, load balance, active power, and reactive power.

11. The meter of claim 1, wherein the notification signal includes a signal selected from the group consisting of: signal over wired medium, wireless signal, Wireless Local Area Network signal, Local Area Network signal, Bluetooth signal, cellular network signal, signal over telephone network, and signal over power lines.

12. A system for verifying the operation of an electricity meter configured to monitor electrical power consumption due to a plurality of loads, comprising:
   an electric power tracker configured to obtain data indicative of aggregate power demand of a number of loads as measured by the meter,
   a load tracker configured to detect the effect of individual loads on the basis of distinctive load patterns in said data, wherein the tracker is configured to utilize a distinctive load pattern detected in said data as at least a basis for a reference pattern for subsequent detections of the effect of the same load in the data,
   an accuracy analyzer configured to, on the basis of a comparison of subsequent detections of the effect of loads with the corresponding references, determine whether the comparisons relating to at least two loads each indicate the difference between the subsequent pattern and the corresponding reference exceeding a predetermined threshold, and
   a notifier configured to trigger, provided that positive determination has taken place, a notification signal indicative of potential fault with the electricity meter.

13. The system of claim 12, comprising an electronic device at least functionally connected to the electricity meter.

14. A method for verifying the operation of electricity meter, comprising:
   obtaining data indicative of aggregate power demand of a number of loads,
   detecting the effect of individual loads in said data on the basis of distinctive load patterns therein, wherein a distinctive load pattern detected in said data is utilized as at least a basis for a reference pattern for subsequent detections of the effect of the same load in the data,
   comparing subsequent detections of the effect of loads with the corresponding references, and determining whether such comparisons relating to at least two loads each indicate the difference between the subsequent pattern and the corresponding reference exceeding a predetermined threshold, and
   triggering, provided that positive determination has taken place, a notification signal indicative of potential fault with the electricity meter.

15. A computer program product comprising a non-transitory computer readable medium having stored thereon code that when run on a computer executes the method items of claim 14.

16. The computer program product of claim 15 comprising a memory card, memory stick, hard disc or optical disc.

* * * * *